United States Patent [19]
Heine

[11] Patent Number: 5,221,347
[45] Date of Patent: Jun. 22, 1993

[54] APPARATUS FOR COATING BOTH SIDES OF PLATE-LIKE SUBSTRATES

[75] Inventor: Werner Heine, Winnenden, Fed. Rep. of Germany

[73] Assignee: Böllhoff Verfahrenstechnik GmbH & Co. KG, Bielefeld, Fed. Rep. of Germany

[21] Appl. No.: 608,269

[22] Filed: Nov. 2, 1990

[30] Foreign Application Priority Data

Nov. 7, 1989 [DE] Fed. Rep. of Germany ....... 3937071

[51] Int. Cl.⁵ .............................. B05B 5/08; B05C 9/04
[52] U.S. Cl. ..................................... 118/630; 118/70; 118/300; 118/322; 118/324; 118/326
[58] Field of Search ............... 118/66, 64, 326, 314, 118/301, 406, 324, 630, 503, 300, 629, 634, 322, 70, 628, 642; 198/33 AD; 427/13, 33

[56] References Cited

U.S. PATENT DOCUMENTS

| | | | |
|---|---|---|---|
| 2,723,921 | 11/1955 | Starkey | 118/630 |
| 2,888,362 | 5/1959 | Starkey | 118/630 |
| 3,343,504 | 9/1967 | Beik | 118/406 |
| 3,467,063 | 9/1969 | Brinkley et al. | 118/314 |
| 3,505,951 | 4/1970 | Gartrell | 118/406 |
| 3,557,938 | 1/1971 | Christensen | 118/324 |
| 3,561,135 | 2/1971 | Fulford | 118/326 |
| 3,610,397 | 10/1971 | Bok | 118/314 |
| 4,096,821 | 6/1978 | Greeneich | 118/301 |
| 4,264,416 | 4/1981 | Noz | 118/406 |
| 4,463,704 | 8/1984 | Farnam | 118/324 |
| 4,624,213 | 11/1986 | Long et al. | 118/300 |
| 4,664,060 | 5/1987 | Roberts | 118/326 |
| 4,836,137 | 6/1989 | Heine | 118/663 |
| 4,867,099 | 9/1989 | Heine | 118/630 |
| 4,869,972 | 9/1989 | Linda et al. | 118/300 |
| 4,871,584 | 10/1989 | Weber | 427/96 |
| 4,947,787 | 8/1990 | Grah et al. | 118/314 |
| 4,948,455 | 8/1990 | Woodley | 156/508 |
| 4,949,665 | 8/1990 | Weber | 118/314 |

FOREIGN PATENT DOCUMENTS 3735798 5/1989 Fed. Rep. of Germany .
2101066 1/1983 United Kingdom .

*Primary Examiner*—Willard E. Hoag
*Attorney, Agent, or Firm*—Peter K. Kontler

[57] ABSTRACT

Successive plate-like substrates are transported in a horizontal plane on a first conveyor beneath a first spray coating device on their way toward an inverting device which turns successive substrates through 180° and deposits them on the supporting elements of a second conveyor which advances the once coated substrates beneath a second spray coating device. The twice coated substrates are advanced through a drying zone wherein they are acted upon at both sides by infrared heaters which expel the surplus of moisture. The supporting elements are in mere linear or point contact with the coated undersides of inverted substrates above the second conveyor. Such supporting elements can engage uncoated marginal portions of the substrates or the coated portions of undersides of substrates above the second conveyor. Coating material which bypasses the substrates is intercepted and collected, and the supporting elements are cleaned at regular intervals.

20 Claims, 2 Drawing Sheets

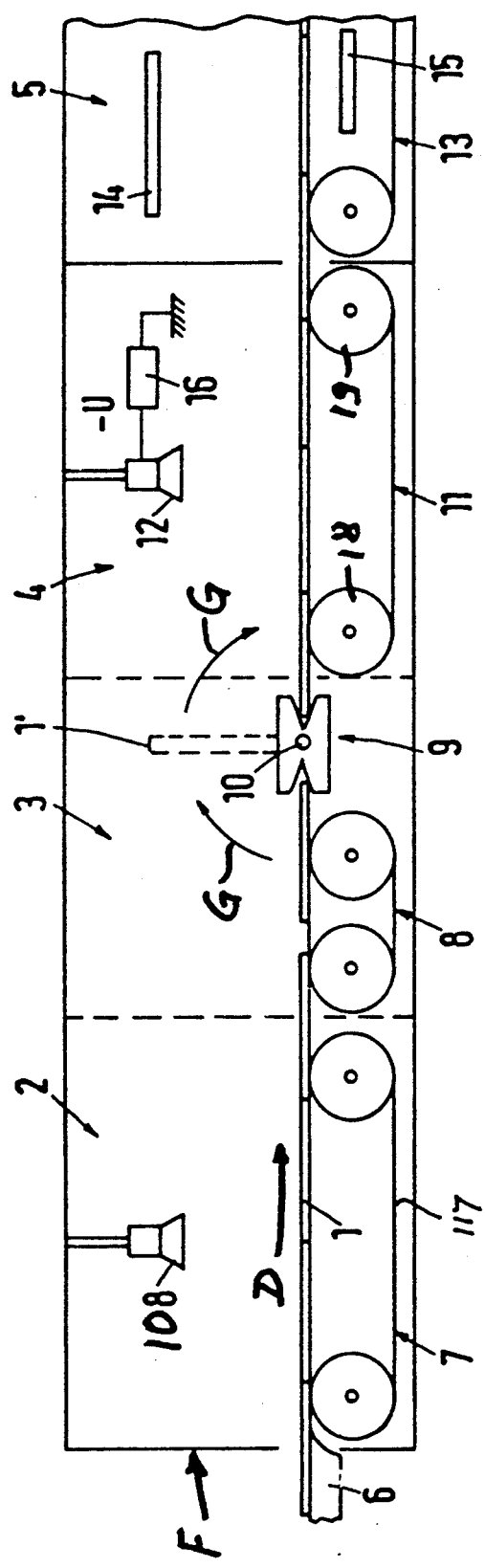
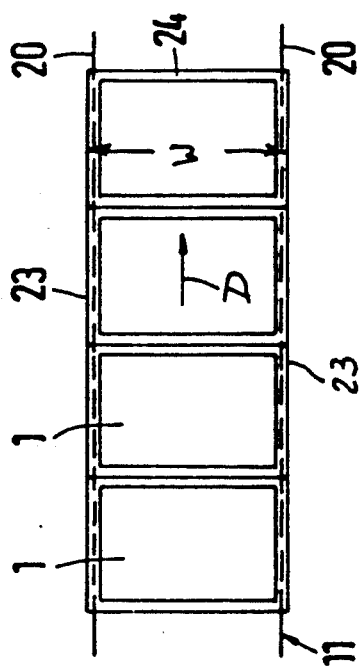
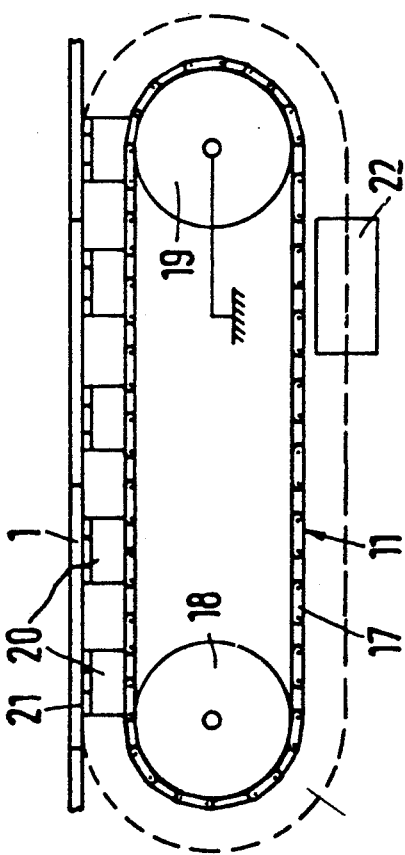

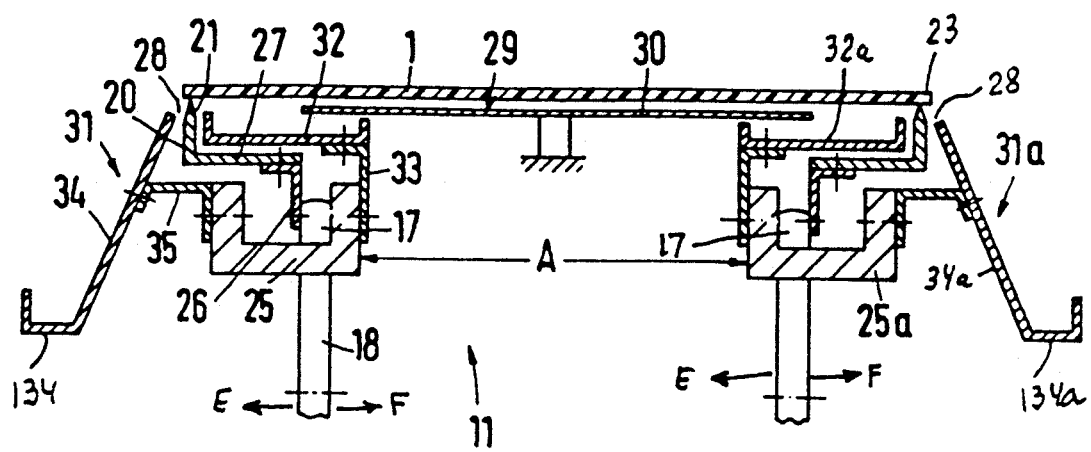
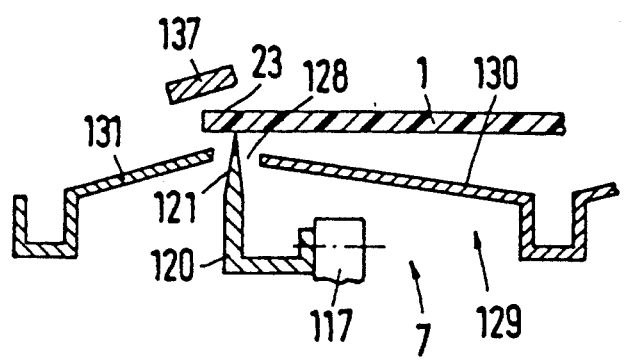
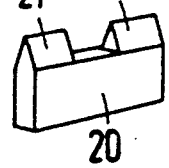
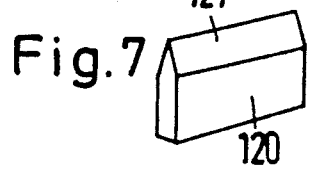
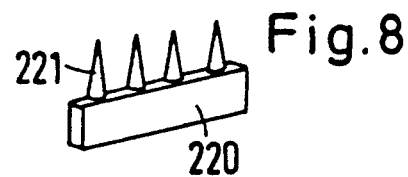
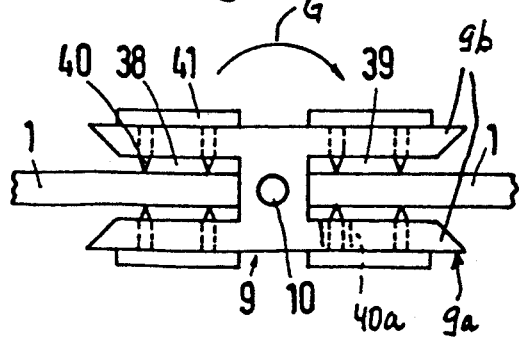
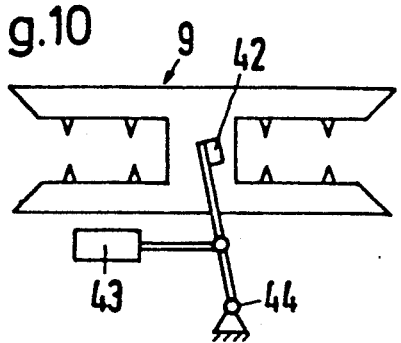

APPARATUS FOR COATING BOTH SIDES OF PLATE-LIKE SUBSTRATES

BACKGROUND OF THE INVENTION

The invention relates to improvements in methods of and in apparatus for applying coating material to substantially plate-like substrates, especially to circuit boards. More particularly, the invention relates to improvements in methods of and in apparatus of the type described in U.S. patent application Ser. No. 095,319, filed Sept. 10, 1987, and now U.S. Pat. No. 4,836,137 granted Jun. 6, 1989 to Heine et al.

The apparatus of Heine et al. comprises a continuously driven transporting unit which advances successive substrates of a series of substrates along an elongated horizontal path beneath an applicator which sprays coating material (such as photosensitive resist or solder resist) onto the upper sides of successive substrates. The applicator is an electrostatic applicator with a rotary atomizer for coating material. Freshly coated substrates are advanced into a drying unit which expels moisture from the applied coating material. The patented apparatus is equipped or combined with an automatic feeder which supplies substrates to the transporting unit ahead of the spray coating station. Such apparatus can process large numbers of substrates per unit of time. However, only one side of each substrate is provided with coating material so that, if both sides of each substrate are to be provided with coats of a flowable material, it is necessary to deliver the substrates to the patented apparatus for a second time but in inverted condition so that the uncoated sides of the redelivered substrates face upwardly during transport past the coating station. A drawback of such mode of coating both sides of successive substrates is that one of the coats is dried twice. Moreover, the interval of time which is required to coat both sides of a given number of substrates is rather long because the substrates can be inverted only after the initially applied coats are sufficiently dry and stable in order to avoid damage as a result of contact with the transporting unit during renewed advancement beneath the coating means.

Published German patent application No. 37 35 798 of Grah et al. discloses an apparatus which can simultaneously apply coats to both sides of each of a series of successive substrates. The inverters propose to advance the substrates in suspended condition so that each of their sides is located in a vertical plane. The application of coating material to one side of each of a series of successive substrates precedes the application of coating material to the other side, and the applied coats are thereupon dried simultaneously downstream of the second coating station. If both coating stations are to be disposed at the same side of the path for suspended substrates, it is necessary to equip the apparatus of Grah et al. with a turn-around device which changes the orientation of successive substrates through 180° by turning each substrate about a vertical axis. The substrates are delivered into the range of the transporting means by h and, and it is necessary to manually detach successive treated substrates from the transporting unit. Successive substrates of the series of suspended substrates are separated from each other by vertically extending gaps which must be relatively wide if the substrates are to be turned about vertical axes. The gaps permit large quantities of sprayed coating material to bypass the advancing substrates. Moreover, the coating action is not predictable because droplets or streamlets of coating material tend to flow along the respective sides of the substrates under the action of gravity. Relatively large droplets of photosensitive resist exhibit a pronounced tendency to flow along the respective sides of the advancing substrates. The same applies for solder resist, especially if the viscosity of such coating material is relatively low. An additional drawback of the apparatus of Grah et al. is that the transporting unit undergoes pronounced contamination, especially if the applicators include devices for electrostatically spray coating the sides of suspended substrates.

Another spray coating apparatus for plate-like substrates is disclosed in U.S. Pat. No. 4,867,099 to Heine et al.

OBJECTS OF THE INVENTION

An object of the invention is to provide an apparatus which can apply coats to both sides of each of a series of substantially plate-like substrates at a high frequency and with optimum drying of coats on the substrates.

Another object of the invention is to provide the apparatus with novel and improved means for transporting and otherwise manipulating substrates in such a way that the distribution of coating material at both sides of each substrate is less affected by the force of gravity than in heretofore known apparatus.

A further object of the invention is to provide the apparatus with novel and improved means for reducing contamination by coating material which bypasses the substrates.

An additional object of the invention is to provide the apparatus with novel and improved means for changing the orientation of once coated substrates without affecting the integrity and/or quality of applied coats.

Still another object of the invention is to provide an apparatus which can recover all or practically all coating material that bypasses the substrates.

A further object of the invention is to provide the apparatus with novel and improved means for reliably supporting substrates during transport past several coating stations.

Another object of the invention is to provide a simple and compact apparatus which can turn out larger numbers of twice coated substrates per unit of time than heretofore known apparatus.

An additional object of the invention is to provide an apparatus which can be readily adjusted to accept larger, smaller, narrower or wider substrates.

A further object of the invention is to provide an apparatus wherein portions of substrates from which coating material is being removed or shifted during certain stages of treatment can be automatically recoated prior to completion of treatment.

Another object of the invention is to provide a novel and improved method of rapidly, reliably and predictably coating both sides of each of a short or long series of substrates.

A further object of the invention is to provide a method which ensures that neither of the coated sides of a substrate is overdried or is subjected to less than satisfactory drying.

SUMMARY OF THE INVENTION

One feature of the present invention resides in the provision of an apparatus for applying a flowable coating material to both sides of substantially plate-like substrates (such as circuit boards having a square or rectangular outline). The improved apparatus comprises means for transporting a series of substrates in a predetermined direction along an elongated preferably substantially horizontal path including a first portion wherein one side of each substrate faces upwardly, means for inverting successive substrates of the series in a second portion of the path downstream f the first portion so that the other side of each inverted substrate faces upwardly, a first applicator having means for coating the one side of each successive substrate of the series in the first portion of the path, a second applicator having means for coating the other side of each substrate of the series in a third portion of the path downstream of the second portion, and means for supporting selected (coated and/or uncoated) portions of the one side of each substrate in the third portion of the path.

The transporting means can include a first conveyor having means for preferably continuously advancing substrates along the first portion of the path, and a second conveyor having means for preferably continuously advancing substrates along the third portion of the path. The supporting means is provided on the advancing means of the second conveyor, and the inverting means includes means for transferring substrates between the first and second conveyors, preferably from a singularizing conveyor downstream of the first conveyor onto the second conveyor. Each coating means preferably includes means for spraying moist coating material from above onto the substrates in the respective (first and third) portions of the path. The supporting means can be designed to contact coated portions of the one side of each inverted substrate in the third portion of the path.

The supporting means can include supporting elements which contact the marginal portions of substrates in the third portion of the path. Pairs of such marginal portions can extend in the predetermined direction, and the supporting elements can be positioned or distributed to contact both parallel marginal portions of each inverted substrate in the third portion of the path. The supporting elements can be in linear contact or in mere point contact with the one side of each inverted substrate in the third portion of the path. For example, each supporting element can be provided with an elongated edge which extends in the predetermined direction and contacts the one side of a substrate in the third portion of the path. Such supporting elements (with elongated edges) can be spaced apart from each other in the predetermined direction and can form one or more rows of at least substantially aligned supporting elements.

The apparatus can further comprise at least one cover or shroud which is provided at the first portion of the path and is positioned to prevent coating of the aforediscussed selected portions of the one side of each non-inverted substrate by the coating means of the first applicator.

The transporting means can include means for moving the second conveyor along an endless path having a first section adjacent the third portion of the elongated path and a second section. Such apparatus can further comprise means for cleaning the supporting means in the second section of the endless path for the second conveyor in order to remove coating material before the supporting means engages an oncoming freshly inverted substrate.

The inverting means can include means for turning successive once-coated substrates of the series through approximately 180° about an axis which extends transversely of the elongated path, and means pushing successive turned substrates into the third portion of the elongated path so that successive turned substrates form a file of abutting substrates.

The first conveyor can receive unturned substrates at such frequency that the substrates thereon are disposed at least substantially end-to-end and are advanced toward the inverting means at a first speed. The second conveyor can advance inverted substrates at a second speed which can match the first speed, and the aforementioned singularizing conveyor can be constructed and assembled to advance successive substrates from the first conveyor to the turning means at a third speed which exceeds the first speed so that the singularizing conveyor establishes clearances or gaps between successive non-inverted substrates which reach the turning means of the inverting means.

The supporting means can include several rows of supporting elements for inverted substrates, and such supporting elements are mounted on the advancing means of the second conveyor. The rows of supporting elements are spaced apart from each other and preferably extend in the predetermined direction. Such apparatus can further comprise means for varying the distance between the rows of supporting elements.

The apparatus can also comprise means for intercepting discharged but non-applied coating material beneath the elongated path. The width of the intercepting means can exceed the width of substrates in the elongated path. Such intercepting means can be provided with at least one slot for the supporting means. For example, the intercepting means can be provided with a plurality of parallel slots which extend in the predetermined direction. In accordance with a presently preferred embodiment, the intercepting means can comprise a stationary portion and at least one mobile portion. The at least one mobile portion can be provided with a slot for the elements of the supporting means. Means can be provided to adjustably carry the at least one mobile portion and the supporting means.

At least one of the coating means can include means for electrostatically spray coating the respective sides of the substrates. The supporting means is then preferably designed to conduct current and is grounded.

The inverting means can include means (such as the aforementioned turning means) for clampingly engaging the sides of successive substrates of the series of substrates for transfer onto the second conveyor. The engaging means can include means for contacting predetermined or preselected portions of coated and/or still uncoated sides of substrates which are in the process of leaving the first portion of the path, e.g., successive singularized substrates if the transporting means comprises a singularizing conveyor between the first conveyor and the turning means of the inverting means.

Another feature of the invention resides in the provision of a method of applying a flowable moisture-containing coating material to both sides of substrates (such as circuit boards). The improved method comprises the steps of transporting a series of substrates in a predetermined direction along an elongated substantially horizontal path having a first portion wherein one side of each substrate faces upwardly, inverting successive substrates of the series of substrates in a second portion of the path downstream of the first portion so that the other side of each inverted substrate faces upwardly, applying coating material to the one side of each substrate in the first portion of the path, and applying coating material to the other side of each substrate in a third portion of the path downstream of the second portion. The method preferably further comprises the step of simultaneously expelling moisture from applied coating material at both sides of substrates in a fourth portion of the path downstream of the third portion.

The novel features which are considered as characteristic of the invention are set forth in particular in the appended claims. The improved apparatus itself, however, both as to its construction and its mode of operation, together with additional features and advantages thereof, will be best understood upon perusal of the following detailed description of certain presently preferred specific embodiments with reference to the accompanying drawing.

BRIEF DESCRIPTION OF THE DRAWING

FIG. 1 is a fragmentary schematic side elevational view of an apparatus which embodies one form of the invention;

FIG. 2 is an enlarged schematic side elevational view of the second conveyor;

FIG. 3 is a plan view of a series of abutting substrates on the second conveyor;

FIG. 4 is an enlarged transverse vertical sectional view of the second conveyor;

FIG. 5 is an enlarged fragmentary transverse vertical sectional view of the first conveyor;

FIG. 6 is a perspective view of a supporting element;

FIG. 7 is a perspective view of a modified supporting element;

FIG. 8 is a perspective view of a further supporting element;

FIG. 9 is an enlarged schematic side elevational view of the inverting device; and FIG. 10 is an elevational view of a portion of the inverting device and further shows a device which serves to push inverted substrates from the inverting device onto the second conveyor.

DESCRIPTION OF PREFERRED EMBODIMENTS

Referring first to FIG. 1, there is shown an apparatus which embodies one form of the invention and serves to treat successive square or rectangular plate-like substrates 1 (see also FIG. 3) during transport along an elongated substantially horizontal path and in a predetermined direction as indicated by arrow D. Each substrate 1 is assumed to constitute a circuit board which consists of or contains a plastic material, and each substrate has two parallel relatively narrow marginal portions 23 (each such marginal portion can have a width of 2-3 mm) which extend in the direction (arrow D) of transport of substrates along their horizontal path.

The means for transporting the substrates 1 comprises a first endless chain or belt conveyor 7, a second endless chain conveyor 11 downstream of the first conveyor 7, an endless singularizing conveyor 8 between the conveyors 7 and 11, and a fourth endless chain or belt conveyor 13 downstream of the second conveyor 11. The upper reaches or stretches of the conveyors 7, 8, 11 and 13 are located in or close to a common horizontal plane. A table 6 immediately upstream of the upper reach of the first conveyor 7 receives a series of successive untreated (uncoated) substrates 1 from an automatic feeder (not shown) at a rate such that the substrates 1 on the upper reach of the conveyor 7 are disposed end-to-end, i.e., without any clearances or gaps between successive substrates. This is desirable and advantageous because the upper sides of substrates 1 on the conveyor 7 advance beneath a spray coating device 108 forming part of a first applicator 2 of suitable coating material (e.e., photosensitive resist or solder resist) which is mounted in the frame F of the improved apparatus.

The station for the first applicator 2 is followed by an orientation changing station 3 where the once-coated substrates 1 are turned through 180° by an inverting device 9 which is installed between the singularizing conveyor 8 and the second conveyor 11 of the transporting means. The inverting device 9 includes a substantially H-shaped turning or transferring member 9a (see FIGS. 9 and 10) which is mounted for angular movement about the axis of a horizontal shaft 10 mounted in the frame F and extending at right angles to the direction which is indicated by the arrow D, i.e., at right angles to the elongated path for the substrates 1. A substrate 1 in partly inverted condition (through approximately 90°) is shown in FIG. 1 by broken lines, as at 1'.

A second applicator 4 with a spray coating device 12 is mounted in the frame F at a level above the upper reach of the conveyor 11 to spray a coating material against the uncoated sides of successive substrates 1. The speed of the conveyor 11 can match the speed of the conveyor 7, and the rate of transport or advancement of substrates by the singularizing conveyor 8 and inverting device 9 is preferably such that the inverted substrates 1 on the upper reach of the conveyor 11 are disposed end-to-end. This prevents the coating material which issues from the device 12 from bypassing the inverted substrates 1 advancing toward the fourth conveyor 13 in a drying or moisture expelling zone 5 which is located downstream of the second spray coating station. The zone 5 accommodates infrared heaters 14 and 15 which are respectively installed at a level above and at a level below the corresponding portion of the path for the substrates 1. Thus, the coats which are applied to the two sides of successive substrates 1 are relieved of excess moisture in a simultaneous step which can immediately follow the second coating step. Instead of or in addition to employing infrared heaters 14 and 15 or other radiation sources, excess moisture can be expelled by the surrounding air which (if necessary) can be circulated by suitable fans or the like, not shown.

The first applicator 2 can but need not be identical with the second applicator 4. The coating devices 12 and 108 of FIG. 1 include or constitute rapidly rotating atomizers with electrostatic charging. FIG. 1 shows that the atomizer of the coating device 12 is connected with a high-voltage generator 16 one pole of which is connected to the ground and the other pole of which applies negative high-voltage d-c current U to the atomizer.

The improved apparatus can employ modular spray coating devices which are assembled and distributed in dependency upon the nature of the desired coating action. The opposite potential is supplied by the substrates 1 which are connected to the ground through the medium of the respective conveyors 7 and 11.

Certain details of the second conveyor 11 are shown in FIGS. 2 and 4. The means for advancing successive inverted substrates 1 along the corresponding portion of their path comprises two endless chains 17 which are disposed in two parallel vertical planes extending in the direction of arrow D and having elongated upper reaches or sections for rows of discrete supporting elements 20 which directly contact the inverted substrates 1 advancing beneath the second applicator 4. The lower reaches or sections of the chains 17 advance the supporting elements 20 through a cleaning device 22 which relieves the supporting elements of coating material before the thus cleaned supporting elements return to the upper reaches or sections to engage the coated underside of the oncoming (freshly inverted) substrates. The chains 17 are trained over and are moved by sprocket wheels 18, 19 at least one of which is driven by a suitable motor, not shown, so that the speed of the chains 17 matches or approximates the speed of chains or belts 117 forming part of the conveyor 7 and serving to advance a series of immediately adjacent non-inverted substrates 1 from the table 6, beneath the applicator 2 and toward the singularizing conveyor 8.

The supporting elements 20 have pairs of elongated aligned edges 21 (see particularly FIG. 6) which are in linear contact with selected portions (particularly marginal portions 23) of the adjacent inverted substrates 1. The cleaning device 22 can be designed to remove coating material (if any) only from the edges 21 of those supporting elements 20 which advance along the lower sections of the endless paths which are defined by the respective chains 17. The supporting elements 20, the chains 217 and the sprocket wheels 18 and/or 19 are made of or contain a current-conducting material, and at least one of the sprocket wheels (note the sprocket wheel 19 of FIG. 2) is connected to the ground. The same applies for the chains 107 and sprocket wheels of the conveyor 7.

FIG. 3 shows that the substrates 1 which are treated in the apparatus of FIG. 1 have a rectangular outline and are disposed end-to-end during advancement with the upper reaches of chains 17 forming part of the second conveyor 11. The width W of each substrate 1 is or can be the same, and the two parallel rows of supporting elements 20 are disposed beneath the respective marginal portions 23 of the single file of substrates on the conveyor 11. The marginal portions 23 of the substrates 1 can be made of a plastic material (the same as the major portions of the substrates) or can be coated with layers 24 of conductive material. The layers 24 can resemble rectangular frames with portions extending along all four sides of the respective substrates 1. Such so-called galvanic zones 24 ensure the establishment of reliable electrical connections with the conductive supporting elements 20 and hence with the chains 17 and sprocket wheels 18, 19 as well as with the ground (by way of the sprocket wheel 19).

FIG. 4 shows that the chains 17 of the conveyor 11 are guided by discrete carrying members 25, 25a each of which has a substantially U-shaped cross-sectional outline. At least some links of the chains 17 carry brackets 26 which, in turn, carry the supporting elements 20 of the respective rows of supporting elements. Each supporting element 20 can be provided with a lateral extension 27 which is riveted, bolted or otherwise fastened to the corresponding bracket 26. Each supporting element 20 has two spaced-apart aligned elongated edges 21 which extend in the direction of arrow D and are in mere liner contacted with the partially coated undersides of substrates 1 above the upper reaches of the chains 17. The edges 21 of those supporting elements 20 which advance with the upper reaches of the respective chains 17 extend upwardly through elongated slots 28 which are defined by the respective mobile portions 31, 31a of an intercepting device 29. The later further includes a stationary portion 30 which is disposed between the two mobile portions 31, 31a. The mobile portions 31, 31a are respectively affixed to the carrying members 25, 25a, i.e., to the frame F. The stationary portion 30 of the intercepting device 29 can constitute a plate which is made of sheet metal and is mounted in the frame F beneath the corresponding portion of the path for the (inverted) substrates 1.

The mobile portion 31 of the intercepting device 29 includes a trough 32 which is inwardly adjacent the respective slot 28 and is affixed to the carrying member 25 by one or more brackets 33. The mobile portion 31 further includes a ramp 34 which is outwardly adjacent the respective slot 28 and the lower end portion 134 of which constitutes a channel for intercepted coating material. A median part of the ramp 34 is secured to the carrying member 25 by one or more brackets 35. The other mobile portion 31a of the intercepting device 29 is a mirror image of the mobile portion 31. The slots 28 which are defined by the mobile portions 31, 31a extend in the direction of the arrow D and are sufficiently wide to provide room for the respective rows of supporting elements 20.

The major percentage of coating material which is supplied by the applicator 4 and bypasses the substrates 1 on the conveyor 11 gathers in the channels 134, 134a at the lower ends of the ramps 34, 34a and is recovered for reuse in the applicator 2 and/or 4. The purpose of the stationary portion 29 and of the troughs 32, 32a of the mobile portions 31, 31a of the intercepting device 29 is to gather coating material which bypasses the inverted substrates 1 on the conveyor 11 if the inverted substrates are not disposed end-to-end. It will be seen that the intercepting device 29 not only recovers non-applied coating material which is discharged by the applicator 4 but also prevents contamination of the conveyor 11 and of other parts of the apparatus beneath the stationary and mobile portions 30, 31, 31a. The width of the intercepting device 29 exceeds the width W of the substrates 1.

The distance A between the carrying members 25, 25a can be varied by resorting to cylinder and piston units, rack and pinion drives or other moving means (not specifically shown). The directions in which the carrying members 25, 25a are movable relative to each other are indicated by arrows E and F. Such adjustability of the carrying members 25, 25a (and hence of the mobile portions 31, 31a of the intercepting device 29) renders it possible to vary the distance between the two slots 28 if a series of substrates 1 having a first width W is followed by a series of wider or narrower substrates. Moreover, such adjustability of the carrying members 25, 25a in directions at right angles to the direction of advancement of substrates 1 with the conveyor 11 renders it possible to accurately select those portions of the undersides of inverted substrates 1 which are to be contacted by the edges 21 of the supporting elements 20 during advancement beneath the second applicator 4. For example, the operator or operators can adjust the distance A between the carrying members 25, 25a for the purpose of ensuring that the edges 21 of the supporting elements 20 will contact only the marginal portions 23 of the adjacent inverted substrates 1, i.e., those portions which perform no function in finished circuit boards. The marginal portions 23 at the underside of the inverted substrates 1 need not be coated during advancement of non-inverted (i.e., about to be inverted)

substrates 1 beneath the applicator 2 if the apparatus further comprises covers or shrouds (one shown at 137 in FIG. 5) which serve to overlie the marginal portions 23 of substrates 1 advancing with the conveyor 7.

Referring now to FIG. 5, there is shown one of two covers or shrouds 137 which are mounted in the frame F and overlie the upper sides of marginal portions 23 of substrates 1 on the first conveyor 7. FIG. 5 further shows one of supporting elements 120 (see also FIG. 7) which are affixed to the endless chains 117 of the conveyor 7 and have elongated edges 121 contacting the marginal portions of uncoated undersides of substrates 1 which advance from the table 6 toward the singularizing conveyor 8. An intercepting device 129 has a stationary portion 130 which is disposed between the two rows of supporting elements 120 and two mobile or outer portions (only the mobile portion 131 is shown in FIG. 5) which are analogous to the mobile portions 31, 31a of the intercepting device 29 of FIG. 4. The edges 121 of the two rows of supporting elements 120 extend upwardly through slots 128 (only one shown in FIG. 5) which are defined by the stationary portion 1130 and the respective mobile portions of the intercepting device 129. The latter collects and returns to the applicator 2 and/or to the applicator 4 or to storage that percentage of coating material which is discharged by the applicator 2 and bypasses the substrates 1 on the conveyor 7.

The edge 121 of the supporting elements 120 for non-inverted substrates 1 can be relatively long (compare FIGS. 6 and 7) because the edges 121 contact the uncoated undersides of such substrates. Of course, it is equally within the purview of the invention to provide each supporting element 120 with a row of two or more edges 121, to provide each supporting element 20 with a single edge 21 or with three or more edges, or to replace the supporting elements 20 and/or 120 with supporting elements 220 of the type shown in FIG. 7. Each supporting element 220 has a row of aligned pointed studs 221 which are in mere point contacted with the undersides of substrates 1 on the conveyor 7 and/or 11.

The details of a presently preferred inverting device 9 are shown in FIG. 9. This device comprises the aforementioned turning or transferring member 9a which is mounted on and can turn relative to or with the shaft 10 through angles of 180°, either back and forth or in a single direction (as indicated by arrow G). The turning member 9a has two mirror symmetrical pockets 38, 39 for marginal portions of successive foremost freshly singularized substrates 1 advancing beyond the conveyor 8. Those portions (9b) of the turning member 9a which flank the pockets 38, 39 carry studs or pins 40 which serve to clampingly engage the marginal portions 23 of substrates 1 in the respective pockets. The illustrated studs or pins 40 constitute piston rods of pistons in cylinders 40a which are installed in the respective portions 9b of the turning member 9a and are overlapped by closures or lids 41. The pins 41 can be replaced by or used in combination with deformable membranes which are acted upon by a pressurized fluid, by springs or by any other suitable clamping or gripping means which can reliably hold marginal portions of a substrate 1 during angular movement in the direction of arrow G to invert the substrate during transfer from the singularizing conveyor 8 onto the supporting elements 20 which advance with the upper reaches of endless chains 17 forming part of the second conveyor 11. All that counts is to ensure that a substrate 1 which is in the process of changing its orientation during transfer between the conveyors 8 and 11 will not be permitted to change it position relative to the turning member 9a; this ensures that the transfer of substrates onto the conveyor 11 can be completed in a predictable way for each of a short or long series of successively transferred substrates.

The distribution of pins 40 on the member 9a is preferably such that the tips of these pins engage only the marginal portions 23 of substrates 1, i.e., those selected portions which were previously engaged by the edges 121 of the supporting elements 120 and are about to be engaged by the edges 21 of the supporting elements 20.

The pointed pins 40 of FIG. 9 can be replaced with clamping members which resemble the supporting elements 20 or 120, i.e., which have edges serving to engage the marginal portions of successive substrates 1 which are about to be transferred onto the conveyor 11.

A starwheel-shaped inverting device for wafer sheets which are to be assembled into wafer sandwiches is disclosed in published British patent application No. 2 101 066 A of Haynes. The apparatus of Haynes is not provided with any equivalents of the aforediscussed supporting elements and cannot be used in the apparatus of the present invention.

FIG. 10 shows that the inverting device 9 is combined or cooperates with a pushing device 42 which is pivotable at 44 about a horizontal axis extending in parallelism with the axis of the shaft 10 and is rockable back and forth by a fluid-operated or other suitable motor 43. The purpose of the pushing device 42 is to expel a freshly inverted substrate 1 from the pocket 38 or 39 subsequent to loosening or retraction of the corresponding studs or pins 40. This ensures that the leading edge of each transferred substrate 1 abuts the trailing edge of the preceding substrate on the upper reach of the conveyor 11.

Referring again to FIGS. 2 and 4, each edge 21 of a supporting element 20 can have a length of 5 mm and the mutual spacing of neighboring supporting elements 20 on each of the chains 17 can be between 50 and 100 mm. The cutting edges 21 can project above the adjacent portion of the intercepting device 29 by a distance of 2 to 5 mm. The entire intercepting device 29 can be made of a metallic sheet material.

The improved apparatus can be used with particular advantage for spray coating both sides of a short or long series of circuit boards with photosensitive resist or with solder resist.

It is further within the purview of the invention to replace the spray coating devices 108, 12 of the applicators 2 and 4 with other types of spray coating devices which do not employ rotary atomizers. For example, the illustrated applicators can be replaced with applicators which spray a resist or another coating material without assistance from air, i.e., in accordance with the so-called airless technique.

An advantage of the transporting means which defines a substantially horizontal path for inverted and non-inverted substrates 1 is that the applied coating material is much less likely to flow along the respective side of a substrate in an uncontrolled or unpredictable manner. Thus, the force of gravity is less likely to influence the distribution of spray coated material than in the aforediscussed apparatus of Grah et al.

An advantage of the supporting elements 20, 120 and 220 is that the extent of contact between their edges (21, 121) or the tips of their studs (221) and the selected portions of adjacent sides of the substrates 1 is minimal. If the supporting elements merely contact uncoated portions or uncoated sides of the substrates, their edges or tips cannot influence the distribution of applied coating material. However, even if a supporting element contacts a coated portion of the adjacent side of a substrate 1, the area of contact is so small that the lines or points of contact with the supporting elements are immediately filled by the adjacent (applied) coating material as soon as the edges 21 or 121 or the tips of the studs 221 are disengaged from the substrates in the region of the sprocket wheels 19. In other words, such lines or points of contact are also coated with flowable material not later than when the substrates are acted upon by the infrared heaters 14 and 15 in the drying or moisture expelling zone 5. Thus, the apparatus (and more particularly the supporting means including the elements 20, 120 and/or 220) is designed in such a way that it takes advantage of flowability of the applied coating material because the tracks which are left by the edges 21 and/or 121 and/or tips of the studs 221 disappear as a result of lateral flow of applied coating material practically instantaneously following termination of contact between the underside of a twice-coated substrate an the supporting elements. This is desirable and advantageous because the transfer of once-coated substrates 1 from the conveyor 7 onto the conveyor 11 can take place without any drying of coats which are applied by the device 108 or an analogous coating device of the first applicator 2. This renders it possible to shorten the interval of time which is required for the treatment of a substrate. Moreover, this renders it possible to simultaneously expel moisture from coats at both sides of a substrate 1 to thus prevent excessive drying of one of the coats and/or insufficient drying of the other coat.

The operation of the improved apparatus can be automated to any desired extent. Thus, the apparatus can employ or can be combined with means for automatically supplying uncoated substrates 1 onto the table 6; the chains 117, 17 of the conveyors 7 and 11 can be driven without any interruptions, the same as the conveyors 8 and 13; the operation of the inverting device 9 (including extension and retraction of the studs or pins 40 and the movements of the pushing device 42) can be fully automatic; and the same holds true for removal or expulsion of twice coated and dried substrates 1 from the drying or moisture expelling zone 5 downstream of the conveyor 11.

Since the supporting elements 20, 120 and/or 220 can contact moist (coated) portions of the undersides of inverted substrates 1 on the conveyor 11, their distribution relative to the undersides of such substrates is not critical because the tracks which are left by the edges 21 and/or 121 and/or studs 221 are covered by the flowable material at the undersides of the inverted substrates. Nevertheless, it is normally preferred to distribute the supporting elements in such a way that they contact the relatively narrow marginal portions 23 of the substrates 1 on the conveyor 11, especially if the marginal portions 23 need not and are not coated during advancement beneath the applicator 2. As mentioned above, the marginal portions 23 of the substrates 1 are or can be extremely narrow; for example, the width of such marginal portions need not exceed 2 mm. It has been found that a relatively small number of supporting elements 20, 120 or 220 along the marginal portions 23 of substrates 1 on the conveyor 11 suffices to adequately support the substrates from below during advancement beneath the second applicator 4. Thus, a relatively small number of extremely narrow edges 21 or 121 or highly pointed studs 221 suffices to maintain the substrates 1 in an optimum position on their way from the inverting device 9 to the drying or moisture expelling zone 5.

The shrouds 137 constitute an optional but desirable and advantageous feature of the improved apparatus. These shrouds prevent the application of coating material to the marginal portions 23 of substrates on the conveyor 7 and reduce the likelihood of contamination of supporting elements 20, 120 or 220 on the chains 117 of the conveyor 7. Nevertheless, it is possible to provide a second cleaning device (not shown) adjacent to the lower reaches of the chains 117 to ensure repeated cleaning of supporting elements on the chains 117.

The pushing device 42 also constitutes an optional but desirable and advantageous feature of the improved apparatus. This device ensures that the substrates 1 on the conveyor 11 are disposed end-to-end and thus prevent the coating material which is discharged by the applicator 4 from contaminating the intercepting device 29 and/or other parts at a level below the upper reaches of the chains 17. For example, the supporting elements which are affixed to the chains 17 are much less likely to be contaminated by sprayed coating material if the substrates 1 on the chains 17 are disposed end-to-end.

The singularizing conveyor 8 serves to reliably introduce successive once-coated substrates 1 into the pocket 38 or 39 of the turning or transferring member 9a of the inverting device 9. Moreover, the conveyor 8 prevents the next-following substrates 1 on the conveyor 7 from interfering with the foremost substrates on the conveyor 7 during inversion of foremost substrates on their way toward the conveyor 11. Relative positions of substrates 1 on the conveyor 7 are the same as on the conveyor 11 if the speed of the chains 17 equals or closely approximates that of the chains 117.

Repeated cleaning of supporting elements on the chains 17 ensures that the supporting elements are invariably connected with the ground even if they happen to be temporarily contaminated by sprays of coating material, e.g., if the inverted substrates 1 on the conveyor 11 are not disposed exactly end-to-end. The cleaning device 22 ensures that each supporting element on each of the two chains 17 is cleaned once during each advancement along the endless path which is defined by the chains 17. The provision of galvanic zones 24 along the marginal portions of the substrates 1 even further enhances reliable grounding of substrates during travel beneath the applicators 2 and 4.

The studs or pins 40 of the inverting device 9 preferably engage uncoated marginal portions 23 of the substrates 1 which are in the process of being transferred from the conveyor 8 onto the conveyor 11. However, and since the studs 40 are pointed, it is actually immaterial whether or not they contact coated or uncoated portions of the substrates, i.e., the applied flowable coating material fills the minute depressions which are formed in the coats on the substrates not later than upon arrival of substrates at the conveyor 13. Thus, the studs 40 cannot adversely affect the condition of the final (dried) coats at the sides of those substrates which leave the drying or moisture expelling zone 5.

I claim:

1. Apparatus for applying a flowable coating material to both sides of circuit boards having pairs of marginal portions extending in a predetermined direction and having a width of up to 3 mm, comprising means for transporting a series of circuit boards in said predetermined direction along an elongated substantially horizontal path including a first portion wherein one side of each circuit board faces upwardly; means for inverting successive circuit boards of the series in a second portion of said path downstream of said first portion so that the other side of each inverted circuit board faces upwardly; a first applicator having means for coating the one side of each successive circuit board of the series in the first portion of said path; a second applicator having means for coating the other side of each circuit board of the series in a third portion of said path downstream of said second portion; and means for supporting only the pair of marginal portions at the one side of each circuit board in said third portion of said path, including a plurality of spaced support means engageable with opposite marginal portions on the one side of each circuit board in line or point contact only.

2. The apparatus of claim 1, wherein said transporting means includes a first conveyor having means for continuously advancing circuit boards along said first portion of said path and a second conveyor having means for continuously advancing circuit boards along said third portion of said path, said supporting means being provided on the advancing means of said second conveyor and said inverting means including means for transferring circuit boards between said first and second conveyors.

3. The apparatus of claim 2, wherein each of said coating means comprises means for spraying coating material from above onto the circuit boards in the respective portions of said path.

4. The apparatus of claim 2, wherein said support elements contact coated marginal portions at the one side of each circuit board in said third portion of said path.

5. The apparatus of claim 1, wherein said supporting elements have elongated edges extending in said direction.

6. The apparatus of claim 1, further comprising at least one shroud provided at said first portion of said path and positioned to prevent coating of marginal portions one side of each circuit board by the coating means of said first applicator.

7. The apparatus of claim 1, wherein said transporting means comprises at least one conveyor for said supporting means and means for moving said at least one conveyor along an endless second path including a first section adjacent said third portion of said elongated path and a second section, and further comprising means for cleaning said supporting means in the second section of said endless path.

8. The apparatus of claim 1 for coating both sides of substantially square or rectangular circuit boards, wherein said inverting means includes means for turning successive circuit boards of the series through approximately 180° about an axis extending transversely of said path, and means for pushing successive turned circuit boards into the third portion of said path so that successive turned circuit boards form a file of abutting circuit boards.

9. The apparatus of claim 1, wherein said transporting means includes a first conveyor having means for advancing circuit boards along the first portion of said path end-to-end at a first speed, a second conveyor having means for advancing circuit boards along the third portion of said path at a second speed, and a singularizing conveyor having means for advancing successive circuit boards from said first conveyor to said inverting means at a third speed exceeding said first speed.

10. The apparatus of claim 9 including means for driving said singularizing conveyor at a speed exceeding said second speed.

11. The apparatus of claim 1, wherein said transporting means includes a conveyor having means for advancing inverted circuit boards along said third portion of said path, said supporting elements forming several rows of on said advancing means.

12. The apparatus of claim 11, wherein said rows are spaced apart from each other and extend in said direction, and further comprising means for varying the distance between said rows.

13. The apparatus of claim 1, further comprising means for intercepting non-applied coating material beneath said path.

14. The apparatus of claim 13, wherein said intercepting means includes a stationary portion and at least one mobile portion.

15. The apparatus of claim 14, wherein said at least one mobile portion has a slot for said supporting means.

16. The apparatus of claim 15, further comprising means for adjustably carrying said at least one mobile portion and said supporting means.

17. The apparatus of claim 1 for applying a flowable coating material to both sides of circuit boards having a predetermined width, further comprising means for intercepting non-applied coating material beneath said path, said intercepting means having a second width greater than said predetermined width and being provided with a plurality of parallel slots for said supporting means, said slots extending in said direction.

18. The apparatus of claim 1 for applying a flowable coating material to both sides of circuit boards wherein the marginal portions at the one side of each circuit board are coated with conductive material, wherein at least one of said coating means includes means for electrostatically spray coating the respective sides of circuit boards, said supporting elements conducting electric current and being grounded.

19. The apparatus of claim 1, wherein said inverting means includes means for clampingly engaging the sides of successive circuit boards of the series of circuit boards.

20. The apparatus of claim 19, wherein said engaging means includes means for contacting the marginal portions of coated and uncoated sides of circuit boards leaving the first portion of said path.

* * * * *